US009686856B2

(12) United States Patent
Song et al.

(10) Patent No.: US 9,686,856 B2
(45) Date of Patent: Jun. 20, 2017

(54) TRANSMISSION LINES (71) Applicant: Finisar Corporation, Sunnyvale, CA (US)

(72) Inventors: Yunpeng Song, Fremont, CA (US); Hongyu Deng, Saratoga, CA (US); Mark Donovan, Mountain View, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 219 days.

(21) Appl. No.: 14/243,757

(22) Filed: Apr. 2, 2014

(65) Prior Publication Data
US 2015/0288049 A1 Oct. 8, 2015

(51) Int. Cl.
*H05K 7/00* (2006.01)
*H05K 1/18* (2006.01)
*H05K 1/02* (2006.01)
*H05K 3/46* (2006.01)
*H01P 5/02* (2006.01)
*H05K 1/00* (2006.01)

(52) U.S. Cl.
CPC .......... *H05K 1/0243* (2013.01); *H01P 5/028* (2013.01); *H05K 1/0242* (2013.01); *H05K 1/18* (2013.01); *H05K 3/4685* (2013.01); *Y10T 29/49155* (2015.01)

(58) Field of Classification Search
CPC ....... H05K 3/3452; H05K 2201/10287; H05K 3/429; H05K 3/284; H05K 3/4046; H01L 2924/01079; H01L 2224/48091
USPC ......... 174/250–251, 261–262, 265; 361/748, 361/760–761, 764, 826, 827
See application file for complete search history.

(56) References Cited

U.S. PATENT DOCUMENTS 5,004,317 A * 4/1991 Jackson et al. .......... G02B 6/36
350/96.2
2009/0294158 A1* 12/2009 Matsushima et al. ... H05K 1/00
174/257

* cited by examiner

*Primary Examiner* — Binh Tran
(74) *Attorney, Agent, or Firm* — Maschoff Brennan (57) ABSTRACT

A circuit may include a first transmission line that includes a first first-line conductor configured to transport a signal and a second first-line conductor. The circuit may also include a second transmission line that includes a first second-line conductor, a second second-line conductor electrically coupled to the second first-line conductor, and a third second-line conductor separated from and positioned between the first and second second-line conductors. The third second-line conductor may be electrically coupled to the first first-line conductor. The circuit may also include a conductive jumper electrically coupling the first and second second-line conductors. The conductive jumper may contact the first and second second-line conductors in a position near the coupling of the first and second transmission lines.

20 Claims, 8 Drawing Sheets

TRANSMISSION LINES

TECHNICAL FIELD

Some embodiments described herein generally relate to transmission lines.

BACKGROUND

Communication modules, such as electronic or optoelectronic transceivers or transponder modules, are used in electronic and optoelectronic communication. Such communication modules may include multiple components that are coupled using transmission lines. The transmission lines may be formed on or in substrates, printed circuit boards, or other signal-carrying material.

The subject matter claimed herein is not limited to embodiments that solve any disadvantages or that operate only in environments such as those described above. Rather, this background is only provided to illustrate one example technology area where some embodiments described herein may be practiced.

SUMMARY

Some example embodiments generally relate to transmission lines.

In an example embodiment, a circuit may include a first transmission line that includes a first first-line conductor configured to transport a signal and a second first-line conductor. The circuit may also include a second transmission line that includes a first second-line conductor, a second second-line conductor electrically coupled to the second first-line conductor, and a third second-line conductor separated from and positioned between the first and second second-line conductors. The third second-line conductor may be electrically coupled to the first first-line conductor and configured to transport the signal. The circuit may also include a conductive jumper that electrically couples the first and second second-line conductors. The conductive jumper may contact the first and second second-line conductors in a position near the coupling of the first and second transmission lines.

In another example embodiment, a circuit may include first and second components and first and second transmission lines. The first transmission line may be electrically coupled to the first component and may include a first signal trace coupled to the first component and a first first-ground trace. The second transmission line may be electrically coupled to the second component and may include a second first-ground trace and a second second-ground trace electrically coupled to the first first-ground trace. The second transmission line may also include a second signal trace separated from and positioned between the first and second second-ground traces. The second signal trace may be electrically coupled to the first signal trace and to the second component. The first component and the second component may be configured to communicate using a signal that traverses the first and second signal traces. The circuit may also include a conductive jumper that may electrically couple the first and second second-ground traces. The conductive jumper may be attached to the first and second second-ground traces near the coupling of the first transmission line to the second transmission line.

In another example embodiment, a method of forming a circuit is provided. The method may include forming a ground-signal (GS) transmission line that includes a first signal trace and a first ground trace and forming a ground-signal-ground (GSG) transmission line that includes a second signal trace, a second ground trace, and a third ground trace. The method may further include electrically coupling the first signal trace and the second signal trace and electrically coupling the first ground trace and the second ground trace. The method may also include electrically coupling the second ground trace and the third ground trace using a conductive jumper. The conductive jumper may be attached to the second and third ground traces near the coupling of the GSG transmission line to the GS transmission line.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the invention will be set forth in the description that follows or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify certain aspects of the present invention, a more particular description of the invention will be rendered by reference to example embodiments thereof which are disclosed in the appended drawings. It is appreciated that these drawings depict only example embodiments of the invention and are therefore not to be considered limiting of its scope. Aspects of the invention will be described and explained with additional specificity and detail through the use of the accompanying drawings in which.

DETAILED DESCRIPTION

Some embodiments described herein relate to a circuit that includes a ground-signal (GS) transmission line that is coupled to a ground-signal-ground (GSG) transmission line. The GS transmission line may include a ground trace and a signal trace. The GSG transmission line may include first and second ground traces and a signal trace. The signal trace of the GSG transmission line and the signal trace of the GS transmission line may be electrically coupled. The first ground trace of the GSG transmission line may also be electrically coupled to the ground trace of the GS transmission line. The circuit may further include a conductive jumper that electrically couples the first and second ground traces of the GSG transmission line. The conductive jumper may contact the GSG transmission line near the coupling of the GSG transmission line to the GS transmission line.

In general, a signal traversing the GSG transmission line may have its electromagnetic field distribution change because of the conductive jumper electrically coupling the first and second ground traces of the GSG transmission line. In particular, the signal may have its electromagnetic field distribution change near to the signal transitioning from the GSG transmission line to the GS transmission line. The electromagnetic field distribution of the signal changing as the signal transitions from the GSG transmission line to the GS transmission line may reduce the distortion of the signal when the signal transitions from the GSG transmission line to the GS transmission line. For example, the electromagnetic field distribution change of the signal may reduce reflections, phase distortion, noise suppression, and amplitude change, among other characteristic changes of the signal, resulting from the signal transitioning from the GSG transmission line to the GS transmission line.

Reference will now be made to the drawings to describe various aspects of example embodiments. It is to be understood that the drawings are diagrammatic and schematic representations of such example embodiments, and are not limiting of the present invention, nor are they necessarily drawn to scale.

Figure 1A:
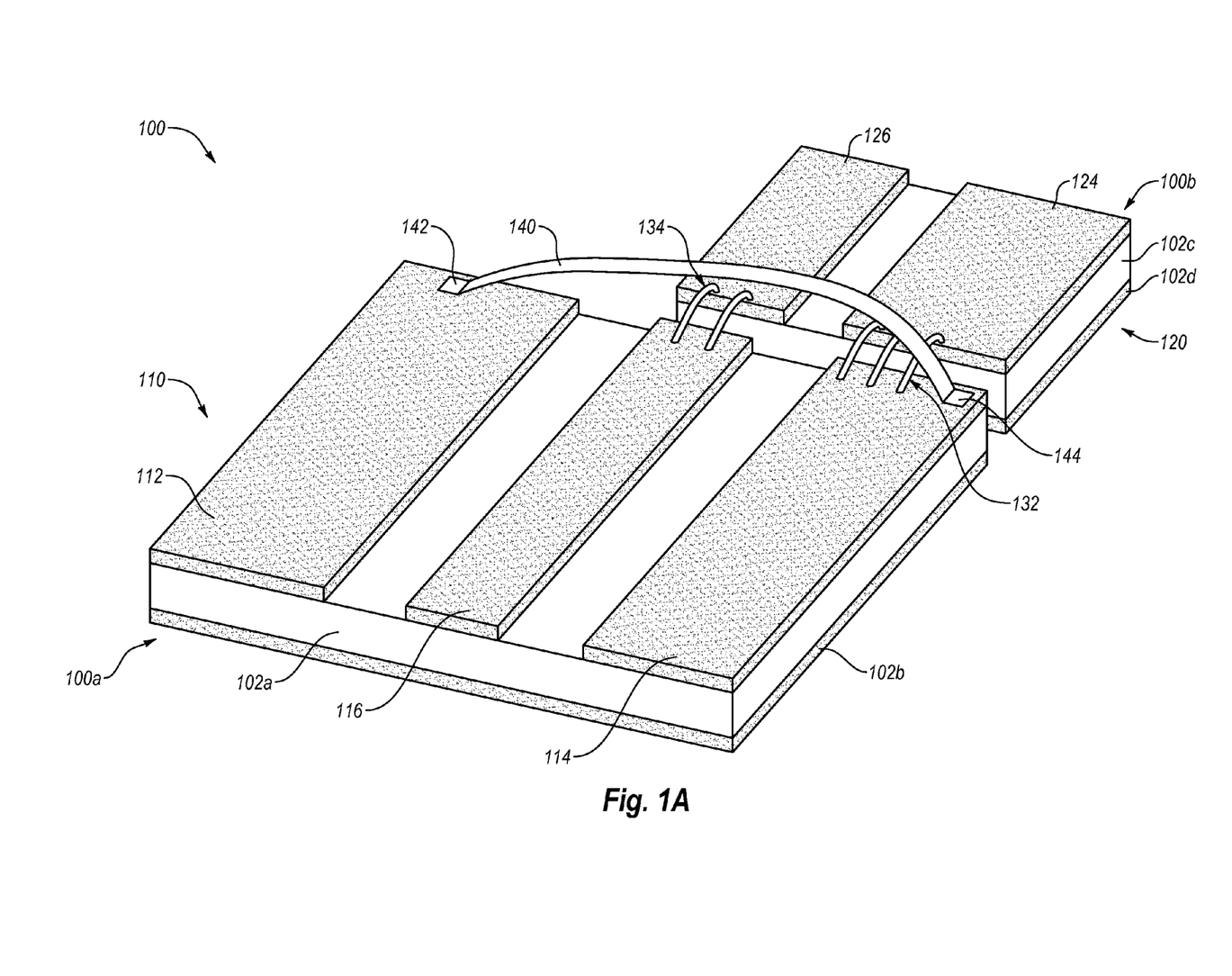
FIG. 1A illustrates a perspective view of an example coupling of transmission lines in a circuit.

FIG. 1A illustrates a perspective view of an example coupling of transmission lines in a circuit 100, arranged in accordance with at least some embodiments described herein. The circuit 100 may include a multi-layered circuit, such as a multi-layered integrated circuit, printed circuit board, or some other multi-layered circuit. The circuit 100 may include a first transmission line 110 and a second transmission line 120. The first transmission line 110 may be part of a first portion 100a of the circuit 100. The first portion 100a may include multiple layers, such as a first layer 102a and a second layer 102b. The first transmission line 110 may be formed in a single layer or in multiple layers of the circuit 100.

The second transmission line 120 may be part of a second portion 100b of the circuit 100. The second portion 100b may include multiple layers, such as a first layer 102c and a second layer 102d. The second transmission line 120 may be formed in a single layer or in multiple layers of the circuit 100. In some embodiments, the first layer 102c and the first layer 102a may correspond and be the same. Alternately or additionally, the second layer 102d and the second layer 102b may correspond and be the same.

The first transmission line 110 may include a first conductor 112, a second conductor 114, and a third conductor 116. The third conductor 116 may be separated from and positioned between the first and second conductors 112 and 114. In particular, a dielectric or insulator may separate the third conductor 116 from the first and second conductors 112 and 114. In some embodiments, the dielectric/insulator may include air, porcelain, silicon, polymers, other suitable dielectric/insulator, or some combination thereof. In the illustrated embodiment of FIG. 1A, the first, second, and third conductors 112, 114, and 116 are arranged in a plane in a same layer of the circuit 100. As a result, the first, second, and third conductors 112, 114, and 116 may be electromagnetically narrow-side coupled.

The first, second, and third conductors 112, 114, and 116 may be formed of conductive material. In some embodiments, the first, second, and third conductors 112, 114, and 116 may include traces. In particular, in some embodiments, the first and second conductors 112 and 114 may include ground traces that are configured to be at a ground potential of the circuit 100. The third conductor 116 may include a signal trace configured to carry a signal at least partially across the circuit 100. In these and other embodiments, the first transmission line 110 may include a ground-signal-ground (GSG) transmission line. As a result, the signal traversing the first transmission line 110 may have a GSG electromagnetic field distribution.

In these and other embodiments, the second layer 102b may be configured to be at a ground potential. In these and other embodiments, the second layer 102b may be electrically coupled to the first and second conductors 112 and 114 such that the first and second conductors 112 and 114 and the second layer 102b may be at the same potential, e.g., a ground potential. The first conductor 112 may be electrically coupled to the second layer 102b by a first electrical via (not illustrated). Alternately or additionally, the second conductor 114 may be electrically coupled to the second layer 102b by a second electrical via (not illustrated).

The second transmission line 120 may include a first conductor 124 and a second conductor 126. The second conductor 126 may be separated from the first conductor 124. In particular, a dielectric and/or insulator may separate the first and second conductors 124 and 126. In the illustrated embodiment of FIG. 1A, the first and second conductors 124 and 126 may be arranged in a plane in a same layer of the circuit 100. As a result, the first and second conductors 124 and 126 may be electromagnetically narrow-side coupled.

The first and second conductors 124 and 126 may be formed of conductive material. In some embodiments, the first and second conductors 124 and 126 may include traces. In particular, in some embodiments, the first conductor 124 may include a ground trace that is configured to be at a ground potential of the circuit 100. The second conductor 126 may include a signal trace configured to carry a signal at least partially across the circuit 100. In these and other embodiments, the second transmission line 120 may include a ground-signal (GS) transmission line. As a result, the signal traversing the second transmission line 120 may have a GS electromagnetic field distribution.

In these and other embodiments, the second layer 102d may be configured to be at a ground potential. In these and other embodiments, the second layer 102d may be electrically coupled to the first conductors 124 such that the first conductor 124 and the second layer 102d may be at the same potential, e.g., a ground potential. The first conductor 124 may be electrically coupled to the second layer 102d by an electrical via (not illustrated).

The second transmission line 120 may be electrically coupled to the first transmission line 110. In particular, the second conductor 114 of the first transmission line 110 may be electrically coupled to the first conductor 124 of the second transmission line 120 by one or more conductive couplers 132. The conductive couplers 132 may include conductive wires or some other conductive coupler. Alternately, the second conductor 114 may be in direct contact with the first conductor 124 to electrically couple together the second conductor 114 and the first conductor 124. Additionally, the third conductor 116 of the first transmission line 110 may be electrically coupled to the second conductor 126 of the second transmission line 120 by one or more conductive couplers 134. The conductive couplers 134 may include conductive wires or some other conductive coupler. Alternately, the third conductor 116 may be in direct contact with the second conductor 126 to electrically couple the third conductor 116 and the second conductor 126 together.

As a signal traverses the circuit 100, the signal may traverse the third conductor 116, the conductive couplers 134 (which may alternately be omitted in some embodiments), and then the second conductor 126. When traversing the third conductor 116, the signal may have an electromagnetic field distribution that is based on the first transmission line 110. When traversing the second conductor 126, the signal may have an electromagnetic field distribution that is based on the second transmission line 120. Because the first transmission line 110 is different from the second transmission line 120, the electromagnetic field distribution of the signal when the signal is traversing the first transmission line 110 is different from the electromagnetic field distribution of the signal when the signal is traversing the second transmission line 120. As a result, when the signal moves from the third conductor 116 to the second conductor 126, the electromagnetic field distribution of the signal may change. The electromagnetic field distribution of the signal changing may result in distortion of the signal. For example, the electromagnetic field distribution of the signal changing may result in phase distortion of the signal, reflections, amplitude loss of the signal, and increased noise, among other distortions of the signal.

To reduce the distortion, the circuit 100 may include a conductive jumper 140. The conductive jumper 140 may have a first portion 142 that is in direct contact with the first conductor 112 near the coupling of the first and second transmission lines 110 and 120 to establish an electrical connection with the first conductor 112. The conductive jumper 140 may also have a second portion 144 that is in direct contact with the second conductor 114 near the coupling of the first and second transmission lines 110 and 120 to establish an electrical connection with the second conductor 114. As a result, the conductive jumper 140 may electrically couple the first conductor 112 and the second conductor 114 near the coupling of the first and second transmission lines 110 and 120. In some embodiments, the conductive jumper 140 may include a conductive wire, a conductive ribbon, or some other type of conductive jumper.

The conductive jumper 140 may effect a change in the electromagnetic field distribution of the signal as the signal approaches and transitions to the second transmission line 120 from the first transmission line 110. The change in the electromagnetic field distribution of the signal caused by the conductive jumper 140 may reduce the distortion that results from the change in the electromagnetic field distribution as the signal transitions from the first transmission line 110 to the second transmission line 120. Because the circuit 100 includes the conductive jumper 140, signals that traverse the circuit 100 may experience reduced signal distortion compared to signals that traverse a circuit otherwise similar to the circuit 100 but without the conductive jumper 140.

In some embodiments, the electromagnetic field distribution of the signal caused by the conductive jumper 140 may reduce distortion of the signal by reducing the significance of the change in the electromagnetic field distribution of the signal when the signal transitions from the first transmission line 110 to the second transmission line 120. For example, the electromagnetic field distribution of the signal when traversing the first transmission line 110 may have a first angle between the electric field and the direction of propagation. The electromagnetic field distribution of the signal when traversing the second transmission line 120 may have a second angle between the electric field and the direction of propagation. An abrupt change in the angle of the electric field from the first angle to the second angle may result in the signal distortion. The conductive jumper 140 may cause the electromagnetic field distribution of the signal near the conductive jumper 140 to have a third angle between the electric field and the direction of propagation that is between the first and the second angles. As a result, a size of the angle change at a given time is reduced and thereby the distortion of the signal is reduced.

The change in the electromagnetic field distribution of the signal caused by the conductive jumper 140 may not be permanent. If the conductive jumper 140 was positioned in the middle of the first transmission line 110, the electromagnetic field distribution of the signal after changing because of the conductive jumper 140 may return to the same electromagnetic field distribution that the signal had before the signal approached or reached the conductive jumper 140. As a result, the signal may experience signal distortion that is the same or approximately the same as the signal distortion experienced by a circuit that does not include the conductive jumper 140. To help the change in the electromagnetic field distribution of the signal caused by the conductive jumper 140 to reduce signal distortion when the signal transitions from the first transmission line 110 to the second transmission line 120, the conductive jumper 140 may be positioned close to the location where the signal transitions from the first transmission line 110 to the second transmission line 120.

Figure 1B:
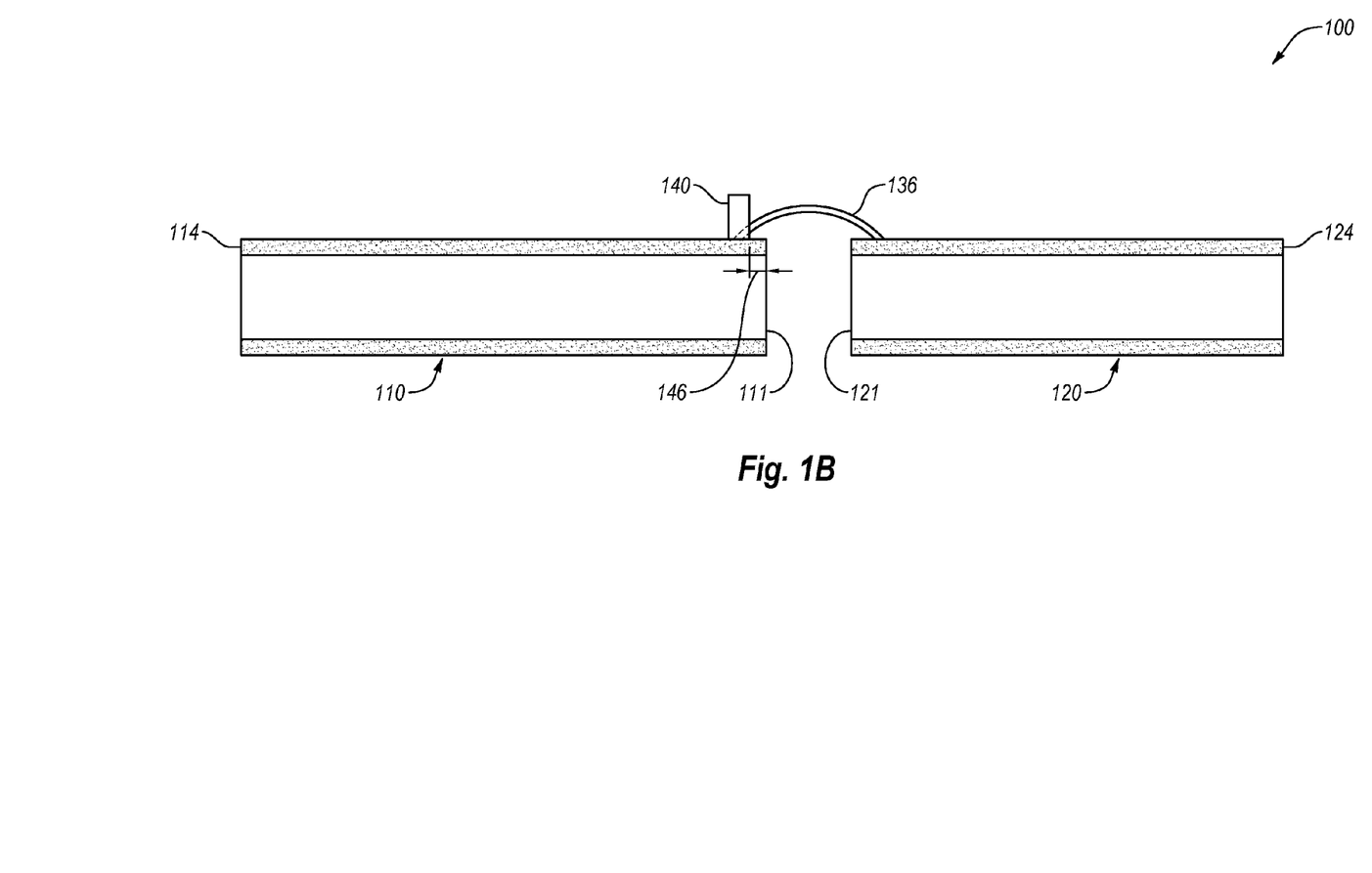
FIG. 1B illustrates a side view of the example coupling of transmission lines in the circuit of FIG. 1A.

FIG. 1B illustrates a side view of the example coupling of the first and second transmission lines 110 and 120 in the circuit 100 of FIG. 1A. As illustrated, the first transmission line 110 may include a first edge 111 and the second transmission line may include a second edge 121. The first edge 111 and the second edge 121 may be adjacent to each other when the first and second transmission lines 110 and 120 are electrically coupled. In some embodiments, the first edge 111 and the second edge 121 may be in direct contact with each other.

The conductive jumper 140 may be positioned near the first edge 111 of the first transmission line 110. In particular, the conductive jumper 140 may be positioned a distance 146 from the first edge 111 of the first transmission line 110. The distance 146 may depend on a frequency of the signal traversing the circuit 100. In some embodiments, the distance 146 may range between 0 and 10,000 micrometers. Alternately or additionally, the distance 146 may range between 0 and 1,000 micrometers. Alternately or additionally, the distance 146 may range between 0 and 200 micrometers. In some embodiments, the distance 146 may have a range that is different from that discussed above. In some embodiments, the distance 146 may be adjusted such that the conductive jumper 140 is positioned as close to the first edge 111 as possible. Modifications, additions, or omissions may be made to the circuit 100 without departing from the scope of the present disclosure.

Figure 2A:
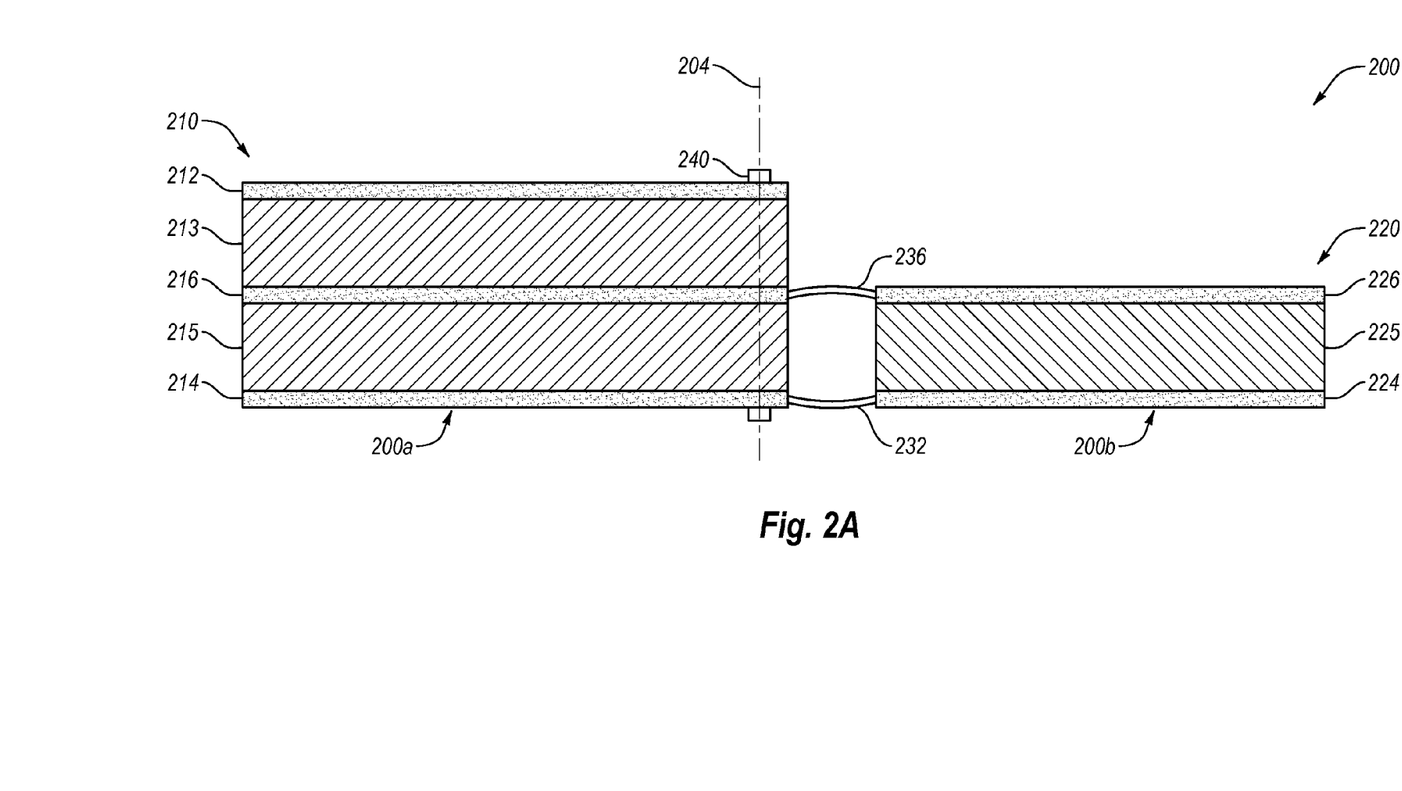
FIG. 2A illustrates a cross-section view of another example coupling of transmission lines in a circuit.

FIG. 2A illustrates a cross-section view of another example coupling of transmission lines in a circuit 200, arranged in accordance with at least some embodiments described herein. The circuit 200 may include a multi-layered circuit, such as a multi-layered integrated circuit, printed circuit board, or some other multi-layered circuit. The circuit 200 may include a first transmission line 210 and a second transmission line 220. The first transmission line 210 may be part of a first portion 200a of the circuit 200. The first portion 200a may include multiple materials, such as a first material 213 and a second material 215. The first transmission line 210 may be formed in multiple layers of the circuit 200. The second transmission line 220 may be part of a second portion 200b of the circuit 200. The second portion 200b may include multiple layers. The second transmission line 220 may be formed in multiple layers of the circuit 200.

The first transmission line 210 may include a first conductor 212, a second conductor 214, and a third conductor 216. The third conductor 216 may be separated from and positioned between the first and second conductors 212 and 214. In particular, the first material 213 may separate the first conductor 212 and the third conductor 216 and the second material 215 may separate the third conductor 216 and the second conductor 214. In some embodiments, the first material 213 and the second material 215 may be the same or different materials. In some embodiments, the first and second materials 213 and 215 may be layers. In some embodiments, the first and second materials 213 and 215 may be insulators or dielectrics such as silicon, polymers, or some combination thereof. In the illustrated embodiment of FIG. 2A, the first, second, and third conductors 212, 214, and 216, may be arranged in different layers of the circuit 200. As a result, the first, second, and third conductors 212, 214, and 216 may be electromagnetically broad-side coupled.

In some embodiments, the first and second conductors 212 and 214 may include ground traces that are configured to be at a ground potential of the circuit 200. The third conductor 216 may include a signal trace configured to carry a signal at least partially across the circuit 200. In these and other embodiments, the first transmission line 210 may include a ground-signal-ground (GSG) transmission line.

The second transmission line 220 may include a first conductor 224 and a second conductor 226. The second conductor 226 may be separated from the first conductor 224 by a third material 225. The third material 225 may be similar to or different from the first and second materials 213 and 215. In the illustrated embodiment of FIG. 2A, the first and second conductors 224 and 226 may be arranged in different layers of the circuit 200. As a result, the first and second conductors 224 and 226 may be electromagnetically broad-side coupled.

In some embodiments, the first conductor 224 may include a ground trace that is configured to be at a ground potential of the circuit 200. The second conductor 226 may include a signal trace configured to carry a signal at least partially across the circuit 200. In these and other embodiments, the second transmission line 220 may include a ground-signal (GS) transmission line.

The second transmission line 220 may be electrically coupled to the first transmission line 210. In particular, the second conductor 214 of the first transmission line 210 may be electrically coupled to the first conductor 224 of the second transmission line 220 by one or more conductive couplers 232 that may include one or more conductive wires or some other conductive coupler. Alternately, the second conductor 214 may be in direct contact with the first conductor 224 to electrically couple the second conductor 214 and the first conductor 224. Additionally, the third conductor 216 of the first transmission line 210 may be electrically coupled to the second conductor 226 of the second transmission line 220 by one or more conductive couplers 236 that may include one or more conductive wires or some other conductive coupler. Alternately, the third conductor 216 may be in direct contact with the second conductor 226 to electrically couple the third conductor 216 and the second conductor 226.

To reduce signal distortion as the signal transitions from the first transmission line 210 to the second transmission line 220 as described above with respect to FIGS. 1A and 1B, the circuit 200 may include a conductive jumper 240. The conductive jumper 240 may be electrically coupled to the first conductor 212 and to the second conductor 214 to electrically couple the first and second conductors 212 and 214 together. In particular, the conductive jumper 240 may be coupled to the first and second conductors 212 and 214 near the coupling of the first transmission line 210 to the second transmission line 220.

Figure 2B:
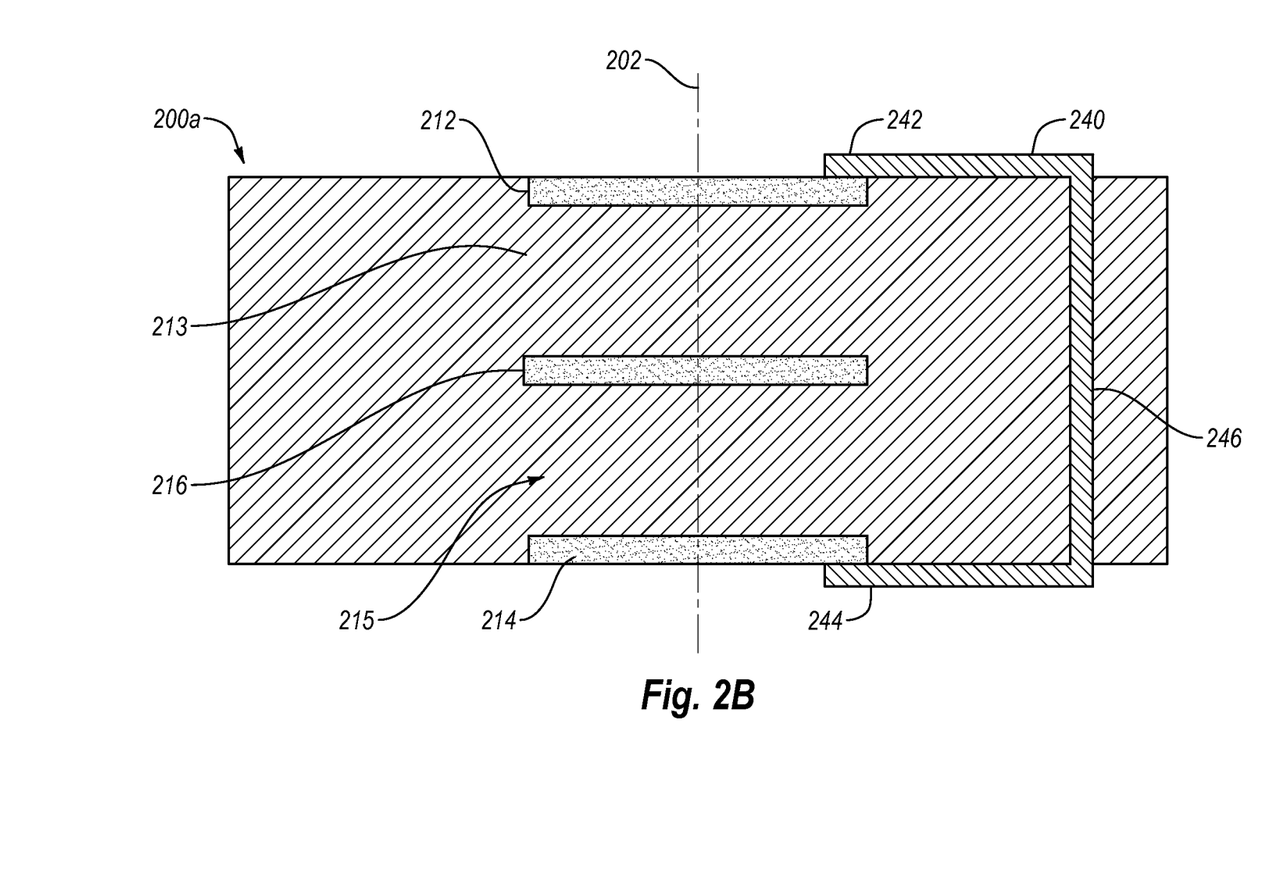
FIG. 2B illustrates another cross-section view of the example coupling of transmission lines in the circuit of FIG. 2A.

FIG. 2B illustrates another cross-section view of the example coupling of the first and second transmission lines 210 and 220 in the circuit 200 of FIG. 2A. In particular, FIG. 2B illustrates a cross-section of the circuit 200 taken along a line 204 of FIG. 2A. FIG. 2A illustrates a cross-section of the circuit 200 taken along a line 202 of FIG. 2B.

FIG. 2B illustrates the conductive jumper 240. In the illustrated embodiments, the conductive jumper 240 is formed by a first portion 242 that contacts the first conductor 212, a second portion 244 that contacts the second conductor 214, and a via 246 that electrically couples the first and second portions 242 and 244. Modifications, additions, or omissions may be made to the circuit 200 without departing from the scope of the present disclosure.

Figure 3A:
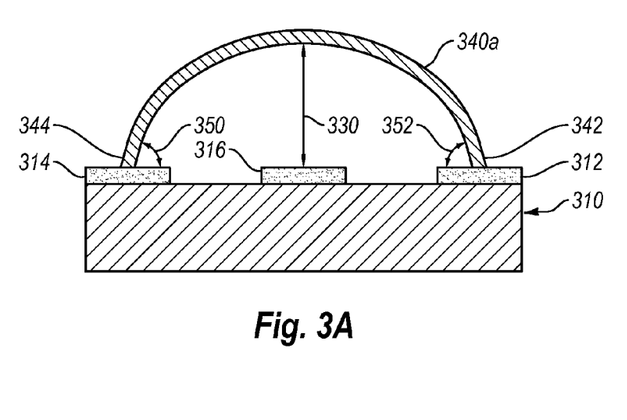
FIG. 3A illustrates an example conductive jumper coupled to a transmission line.

FIG. 3A illustrates an example conductive jumper 340a coupled to a transmission line 310, arranged in accordance with at least some embodiments described herein. The transmission line 310 may be a GSG transmission line that includes first and second ground traces 312 and 314 and a signal trace 316. A first end 342 of the conductive jumper 340a may be coupled to the first ground trace 312. A second end 344 of the conductive jumper 340a may be coupled to the second ground trace 314.

The first end 342 of the conductive jumper 340a may be positioned at or near a middle of the first ground trace 312 such that there is about equal distance between the first end 342 and edges of the first ground trace 312 that are parallel to a propagation direction of a signal on the signal trace 316. The positioning of the first end 342 with respect to the edges of the first ground trace 312 that are parallel to the propagation direction of a signal on the signal trace 316 may affect the electromagnetic field distribution of the signal near the conductive jumper 340a.

The second end 344 of the conductive jumper 340a may also be positioned at or near a middle of the second ground trace 314 such that there is about equal distance between the second end 344 and edges of the second ground trace 314 that are parallel to the propagation direction of a signal on the signal trace 316. In some embodiments, the positioning of the first and second ends 342 and 344 with respect to the first and second ground traces 312 and 314 may be the same or different.

The shape of the conductive jumper 340a may also affect the electromagnetic field distribution of a signal near the conductive jumper 340a. In particular, a length of the conductive jumper 340a, a distance 330 between the conductive jumper 340a and the signal trace 316, angles 350 and 352 between the conductive jumper 340a and the respective first and second ground traces 312 and 314, and a slope and/or curvature of the conductive jumper 340a may affect the electromagnetic field distribution of a signal. For example, when the transmission line 310 is configured to handle higher frequency signals, such as signals with frequencies higher than five gigahertz, the distance 330 may be selected to be relatively smaller when slower frequency signals are handled by the transmission line 310.

FIG. 3A illustrates the angles 350 and 352 being acute angles and the slope or curvature of the conductive jumper 340a approximately following an arc of a circle with a high point over the signal trace 316 to achieve the distance 330 between the signal trace 316 and the conductive jumper 340a.

Figure 3B:
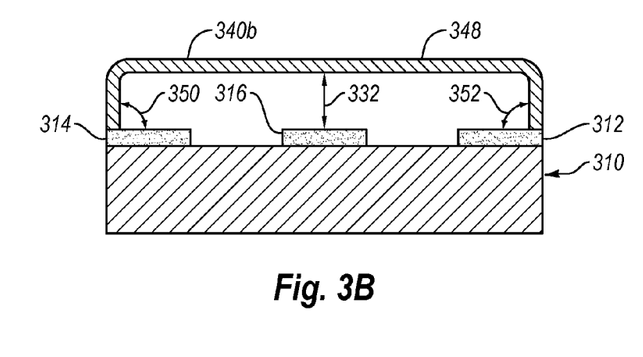
FIG. 3B illustrates another example conductive jumper coupled to a transmission line.

FIG. 3B illustrates another example conductive jumper 340b coupled to the transmission line 310. The conductive jumper 340b couples to the first and second ground traces 312 and 314 such that the angles 350 and 352 form right or approximately right angles. Furthermore, the conductive jumper 340b may have a portion 348 that extends substantially perpendicular to the transmission line 310 at a distance 332 from the signal trace 316 for a majority of the conductive jumper 340b. Furthermore, as illustrated in FIG. 3B, the conductive jumper 340b may couple to the first and second ground traces 312 and 314 near outer edges of the first and second ground traces 312 and 314. As illustrated, the conductive jumper 340a of FIG. 3A may result in electromagnetic field patterns for higher frequency signals that result in less signal distortion than electromagnetic field patterns resulting from the conductive jumper 340b of FIG. 3B.

Figure 4:
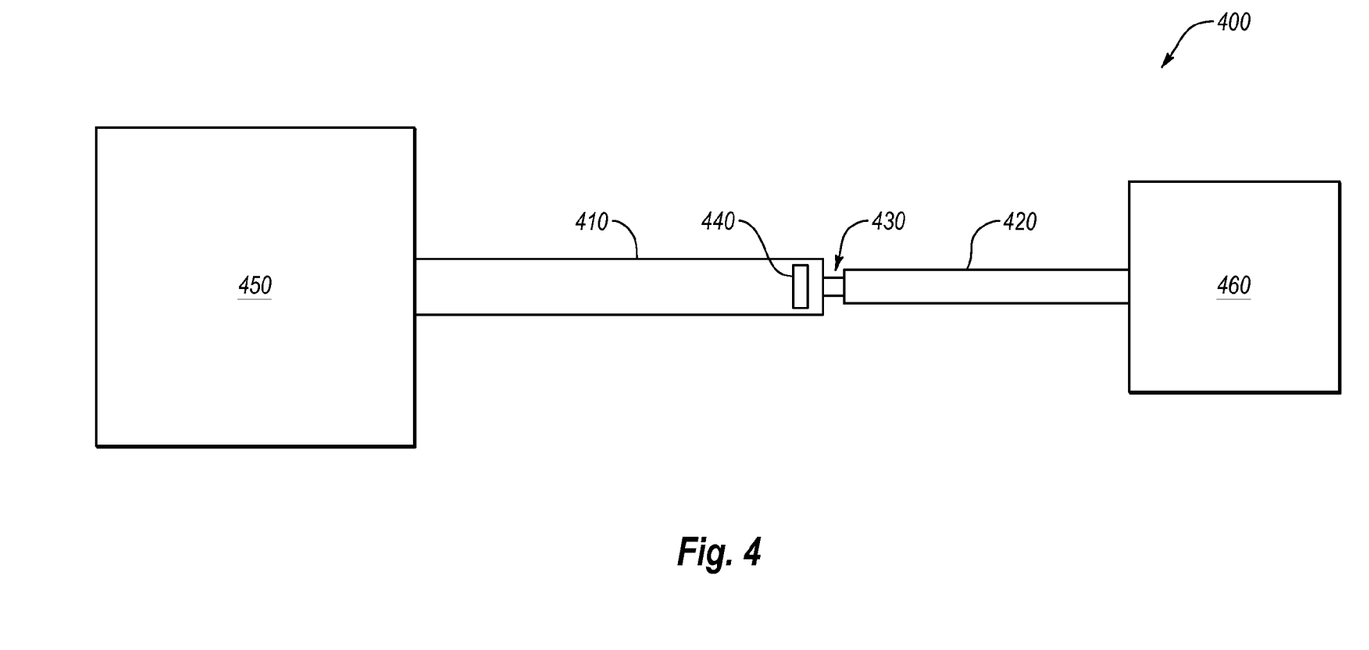
FIG. 4 is a block diagram of an example circuit with coupling of transmission lines.

FIG. 4 is a block diagram of an example circuit 400 with coupling of transmission lines, arranged in accordance with at least some embodiments described herein. The circuit 400 includes a first transmission line 410 that may include a GSG transmission line and a second transmission line 420 that may include a GS transmission line. The first transmission line 410 may be electrically coupled to a first component 450. In particular, a signal line of the first transmission line 410 may be electrically coupled to the first component 450. The second transmission line 420 may be electrically coupled to a second component 460. In particular, a signal line of the second transmission line 420 may be electrically coupled to the second component 460.

The first and second transmission lines 410 and 420 may be electrically coupled by one or more conductive couplers 430. In particular, the signal line of the first transmission line 410 may be electrically coupled to the signal line of the second transmission line 420 by the one or more conductive couplers 430. As a result, the first and second components 450 and 460 may be electrically coupled and configured to communicate using the first and second transmission lines 410 and 420.

The circuit 400 may also include a conductive jumper 440 that is electrically coupled between ground lines of the first transmission line 410 near the junction of the first and second transmission lines 410 and 420. The conductive jumper 440 may change an electromagnetic field distribution of a signal being sent from the first component 450 to the second component 460 as the signal transitions from the first transmission line 410 to the second transmission line 420. The changing of the electromagnetic field distribution of the signal may reduce the signal distortion of the signal as perceived by the second component 460. As a result, the second component 460 may receive a cleaner signal with a larger eye opening, allowing the second component 460 to more easily extract data from the signal. Modifications, additions, or omissions may be made to the circuit 400 without departing from the scope of the present disclosure.

Figure 5:
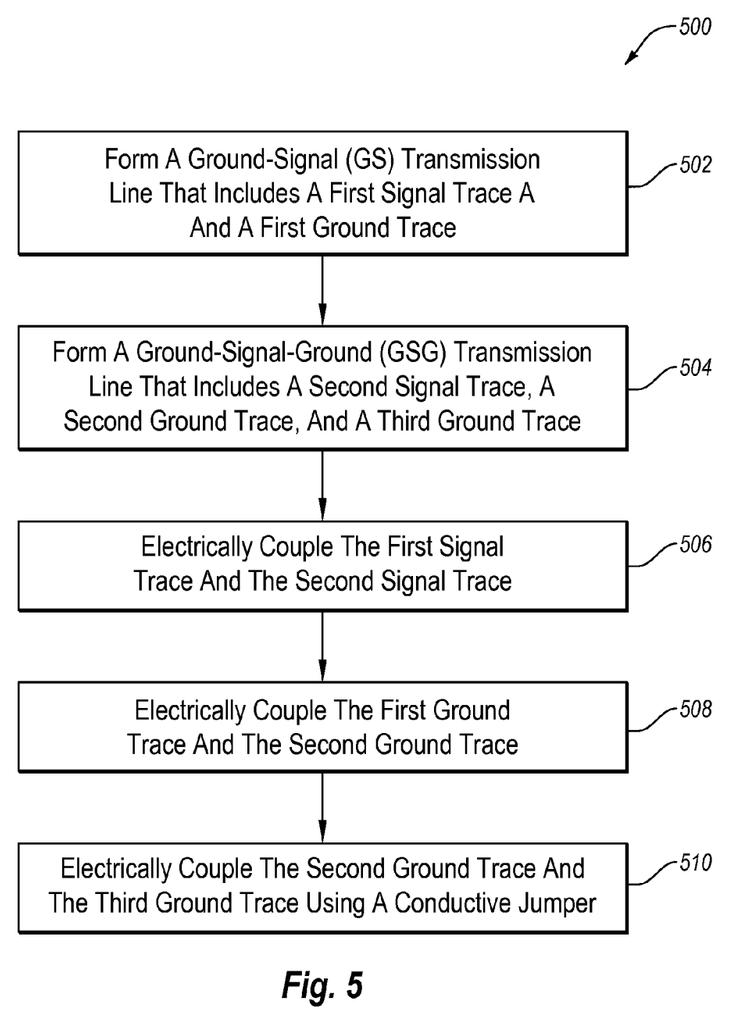
FIG. 5 is a flowchart of an example method of forming a circuit.

FIG. 5 is a flowchart of an example method 500 of forming a circuit, arranged in accordance with at least some embodiments described herein. Although illustrated as discrete blocks, various blocks may be divided into additional blocks, combined into fewer blocks, or eliminated, depending on the desired implementation.

The method 500 may begin at block 502 where a ground-signal (GS) transmission line that includes a first signal trace and a first ground trace may be formed. In block 504, a ground-signal-ground (GSG) transmission line that includes a second signal trace, a second ground trace, and a third ground trace may be formed.

In block 506, the first signal trace and the second signal trace may be electrically coupled. For example, the first and second signal traces may be indirectly electrically coupled together using one or more conductive couplers, or the first and second signal traces may be directly electrically coupled together. In block 508, the first ground trace and the second ground trace may be electrically coupled. For example, the first and second ground traces may be indirectly electrically coupled together using one or more conductive couplers, or the first and second signal traces may be directly electrically coupled together.

In block 510, the second ground trace and the third ground trace may be electrically coupled using a conductive jumper or other suitable conductive element. In some embodiments, the conductive jumper may include a ribbon cable.

In some embodiments, the conductive jumper may be attached to the second and third ground traces such that the conductive jumper extends over the second signal trace to allow air between the conductive jumper and the second signal trace.

The conductive jumper may be attached to the second and third ground traces near the coupling of the GSG transmission line to the GS transmission line to adjust an electromagnetic field distribution of a signal on the second signal trace. In some embodiments, the conductive jumper may be attached to the second and third ground traces within 200 micrometers of an edge of the GSG transmission line that is adjacent to the GS transmission line. Adjusting an electromagnetic field distribution of a signal on the second signal trace may reduce signal distortion as the signal traverses from the GSG transmission line to the GS transmission line.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

Figure 6:
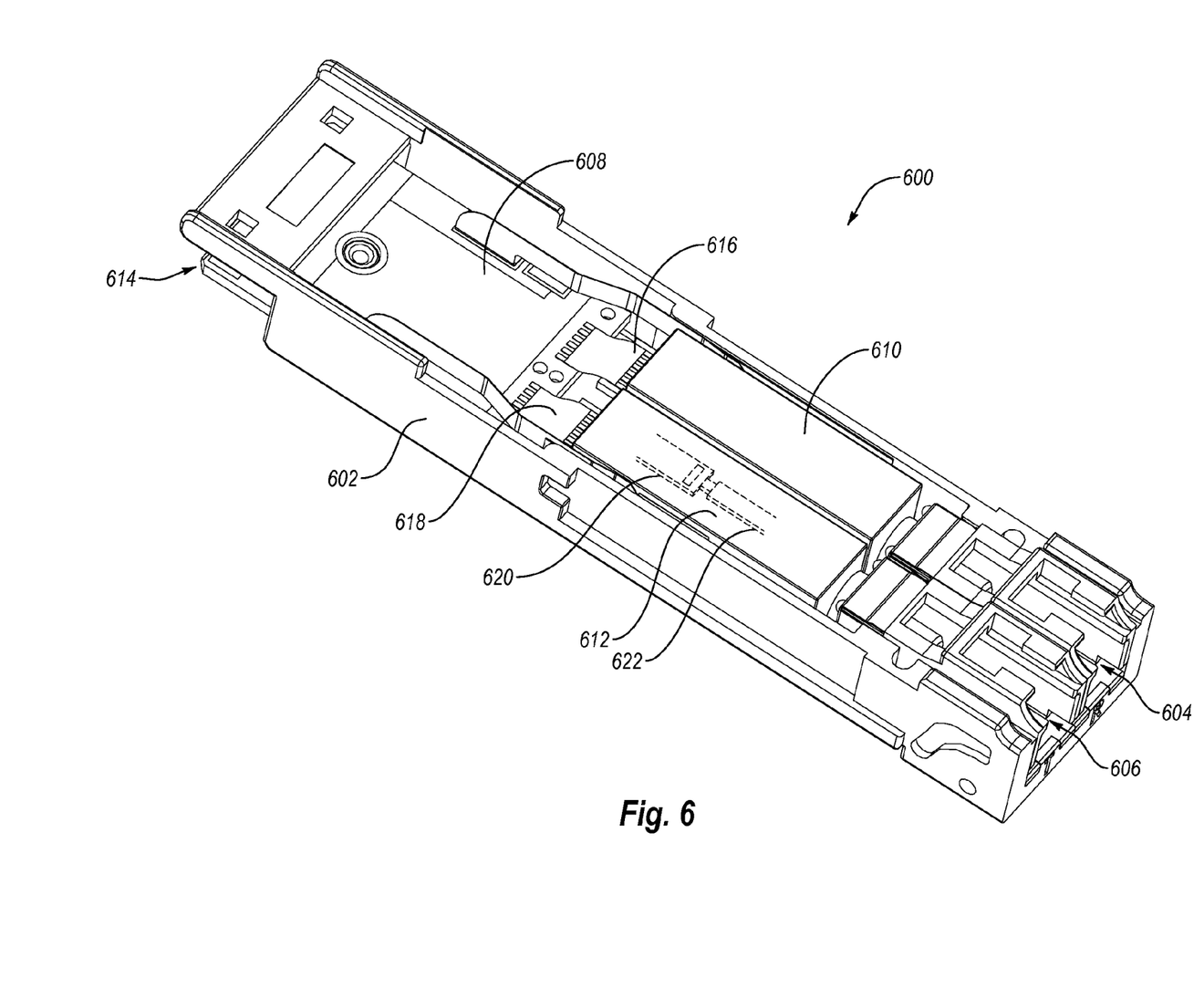
FIG. 6 is a perspective view of an example optoelectronic module.

FIG. 6 is a perspective view of an example optoelectronic module 600 (hereinafter "module 600") that may include a transmission line as described herein, arranged in accordance with at least some embodiments described herein. The module 600 may be configured for use in transmitting and receiving optical signals in connection with a host device (not shown).

As illustrated, the module 600 may include, but is not limited to, a bottom housing 602, a receive port 604, and a transmit port 606, both defined in the bottom housing 602; a PCB 608 positioned within the bottom housing 602; and a receiver optical subassembly (ROSA) 610 and a transmitter optical subassembly (TOSA) 612 also positioned within the bottom housing 602. An edge connector 614 may be located on an end of the PCB 608 to enable the module 600 to electrically interface with the host device. As such, the PCB 608 facilitates electrical communication between the host device and the ROSA 610 and the TOSA 612.

The module 600 may be configured for optical signal transmission and reception at a variety of data rates including, but not limited to, 1 Gb/s, 10 Gb/s, 20 Gb/s, 40 Gb/s, 100 Gb/s, or higher. Furthermore, the module 600 may be configured for optical signal transmission and reception at various distinct wavelengths using wavelength division multiplexing (WDM) using one of various WDM schemes, such as Coarse WDM, Dense WDM, or Light WDM.

Furthermore, the module 600 may be configured to support various communication protocols including, but not limited to, Fibre Channel and High Speed Ethernet. In addition, although illustrated in a particular form factor in FIG. 6, more generally, the module 600 may be configured in any of a variety of different form factors including, but not limited to, the Small Form-factor Pluggable (SFP), the enhanced Small Form-factor Pluggable (SFP+), the 10 Gigabit Small Form-factor Pluggable (XFP), the C Form-factor Pluggable (CFP), and the Quad Small Form-factor Pluggable (QSFP) multi-source agreements (MSAs).

The ROSA 610 may house one or more optical receivers, such as photodiodes, that are electrically coupled to an electrical interface 616. The one or more optical receivers may be configured to convert optical signals received through the receive port 604 into corresponding electrical signals that are relayed to the host device through the electrical interface 616 and the PCB 608. The TOSA 612 may house one or more optical transmitters, such as lasers, that are electrically coupled to another electrical interface 618. The one or more optical transmitters may be configured to convert electrical signals received from the host device by way of the PCB 608 and the electrical interface 618 into corresponding optical signals that are transmitted through the transmit port 606 onto an optical network. The TOSA 612 may include a GSG transmission line 620 coupled to a GS transmission 622 to couple one or more components within the TOSA. For example, the GSG transmission line 620 and the GS transmission 622 may couple a mach zehnder modulator with one or more other components in the TOSA. In these and other embodiments, the ground traces of the GSG transmission line 620 may be electrically coupled by a conductive jumper near the junction of the GSG transmission line 620 and the GS transmission 622 as described herein and illustrated in FIGS. 1A, 1B, 2A, 2B, 3A, 3B, and 4.

The module 600 illustrated with respect to FIG. 6 is one architecture in which embodiments of the present disclosure may be employed. It should be understood that this specific architecture is only one of countless architectures in which embodiments may be employed. The scope of the present disclosure is not intended to be limited to any particular architecture or environment.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A circuit comprising:
   a first transmission line on a first portion of the circuit including:
   a first first-line conductor configured to transport a signal;
   a second first-line conductor;
   a second transmission line on a second portion of the circuit including:
   a first second-line conductor;
   a second second-line conductor on the second portion of the circuit electrically coupled to the second first-line conductor on the first portion of the circuit via a conductive coupler between the first and second portions of the circuit; and
   a third second-line conductor separated from and positioned between the first and second second-line conductors, the third second-line conductor electrically coupled to the first first-line conductor and configured to transport the signal; and
   a conductive jumper on the second portion of the circuit that electrically couples the first and second second-line conductors, wherein the conductive jumper contacts the first and second second-line conductors in a position near the coupling of the first and second transmission lines.

2. The circuit of claim 1, wherein the first transmission line is a ground-signal (GS) transmission line and the second transmission line is a ground-signal-ground (GSG) transmission line.

3. The circuit of claim 1, wherein the circuit is a layered circuit and the first first-line conductor and the second first-line conductor are formed on a same layer of the layered circuit or are each formed on a different layer of the layered circuit.

4. The circuit of claim 1, wherein the circuit is a layered circuit and the first second-line conductor, the second second-line conductor, and the third second-line conductor are formed on a same layer of the layered circuit or are each formed on a different layer of the layered circuit.

5. The circuit of claim 1, wherein the conductive jumper includes a ribbon conductor.

6. The circuit of claim 1, wherein the conductive jumper includes a via.

7. The circuit of claim 1, wherein the first transmission line includes a first edge and the second transmission line includes a second edge, the first edge and the second edge being positioned adjacent to each other when the second second-line conductor is electrically coupled to the second first-line conductor and the third second-line conductor is electrically coupled to the first first-line conductor, wherein the conductive jumper is attached to the second transmission line within 200 micrometers of the second edge.

8. The circuit of claim 1, wherein the conductive jumper extends away from the first and second second-line conductors such that a dielectric is between the conductive jumper and the third second-line conductor.

9. The circuit of claim 8, wherein the dielectric is air.

10. A circuit comprising:
    a first component;
    a first transmission line on a first portion of the circuit, the first transmission line including:
    a first signal trace coupled to the first component; and
    a first first-ground trace;
    a second component;
    a second transmission line on a second portion of the circuit electrically coupled to the second component, the second transmission line including:
    a second first-ground trace;
    a second second-ground trace on the second portion of the circuit electrically coupled to the first first-ground trace on the first portion of the circuit via a conductive coupler between the first and second portions of the circuit; and a second signal trace separated from and positioned between the first and second second-ground traces, the second signal trace electrically coupled to the first signal trace and to the second component, the first component and the second component configured to communicate using a signal that traverses the first and second signal traces; and a conductive jumper on the second portion of the circuit that electrically couples the first and second second-ground traces, wherein the conductive jumper contacts the first and second second-ground traces in a position near the coupling of the first and second transmission lines.

11. The circuit of claim 10, wherein the first transmission line is a ground-signal (GS) transmission line and the second transmission line is a ground-signal-ground (GSG) transmission line.

12. The circuit of claim 10, wherein the circuit is a layered circuit and the first signal trace and the first first-ground trace are formed on a same layer of the layered circuit or are each formed on a different layer of the layered circuit.

13. The circuit of claim 10, wherein the circuit is a layered circuit and the first second-ground trace, the second second-ground trace, and the second signal trace are formed on a same layer of the layered circuit or are each formed on a different layer of the layered circuit.

14. The circuit of claim 10, wherein the first transmission line includes a first edge and the second transmission line includes a second edge, the first edge and the second edge being positioned adjacent to each other when second second-ground trace is electrically coupled to the first first-ground trace and the second signal trace is electrically coupled to the first signal trace, wherein the conductive jumper is attached to the second transmission line within 200 micrometers of the second edge.

15. The circuit of claim 10, wherein the conductive jumper extends away from the first and second second-line conductors such that air is between the conductive jumper and the second signal trace.

16. The circuit of claim 10, wherein the circuit is included in an optical module.

17. A method of forming a circuit, the method comprising:

forming a ground-signal (GS) transmission line on a first portion of the circuit that includes a first signal trace and a first ground trace;

forming a ground-signal-ground (GSG) transmission line on a second portion of the circuit that includes a second signal trace, a second ground trace, and a third ground trace;

electrically coupling the first signal trace and the second signal trace;

electrically coupling the first ground trace on the first portion of the circuit and the second ground trace on the second portion of the circuit via a conductive coupler between the first and second portions of the circuit; and electrically coupling the second ground trace and the third ground trace on the second portion of the circuit using a conductive jumper; the conductive jumper being attached to the second and third ground traces near the coupling of the GSG transmission line to the GS transmission line to adjust an electromagnetic field distribution of a signal on the second signal trace to reduce signal distortion as the signal transitions from the GSG transmission line to the GS transmission line.

18. The method of claim 17, wherein the conductive jumper is a ribbon conductor.

19. The method of claim 17, wherein the conductive jumper is attached to the second and third ground traces within 200 micrometers of an edge of the GSG transmission line that is adjacent to the GS transmission line.

20. The method of claim 17, wherein the conductive jumper is attached to the second and third ground traces such that the conductive jumper extends over the second signal trace to allow air between the conductive jumper and the second signal trace.

* * * * *